(12) United States Patent
Garreau et al.

(10) Patent No.: US 7,443,170 B2
(45) Date of Patent: Oct. 28, 2008

(54) DEVICE AND METHOD FOR DETERMINING AT LEAST ONE VARIABLE ASSOCIATED WITH THE ELECTROMAGNETIC RADIATION OF AN OBJECT BEING TESTED

(75) Inventors: Philippe Garreau, Mennecy (FR); Luc Duchesne, Angervilliers (FR); Per Olav Iversen, Marietta, GA (US); Arnaud Gandois, Breux Jouy (FR)

(73) Assignee: Ste D'Applications Technologies de L'Imagerie Micro Ondes (FR)

( * ) Notice: Subject to any disclaimer, the term of this patent is extended or adjusted under 35 U.S.C. 154(b) by 0 days.

(21) Appl. No.: 10/568,378

(22) PCT Filed: Aug. 13, 2004

(86) PCT No.: PCT/FR2004/002140

§ 371 (c)(1),
(2), (4) Date: Sep. 8, 2006

(87) PCT Pub. No.: WO2005/019842

PCT Pub. Date: Mar. 3, 2005

(65) Prior Publication Data

US 2007/0018654 A1 Jan. 25, 2007

(30) Foreign Application Priority Data

Aug. 14, 2003 (FR) .................................. 03 09951

(51) Int. Cl.
*G01R 31/00* (2006.01)
(52) U.S. Cl. ........................................ 324/501; 324/96
(58) Field of Classification Search ................. 324/501, 324/96
See application file for complete search history.

(56) References Cited

U.S. PATENT DOCUMENTS

| 4,968,983 | A | * | 11/1990 | Maeda | 343/703 |
| 6,329,953 | B1 | * | 12/2001 | McKivergan | 343/703 |
| 6,556,023 | B2 | * | 4/2003 | Okazaki | 324/637 |
| 6,850,851 | B1 | * | 2/2005 | Fourestie et al. | 324/76.11 |
| 7,035,594 | B2 | * | 4/2006 | Wallace et al. | 455/67.12 |

FOREIGN PATENT DOCUMENTS

FR 2 797 327 A 2/2001

OTHER PUBLICATIONS

Fourestie et al., A Novel Near-Field Measurement Facility for Random Emissions:, 2001 International Symposium on Electromagnetic Compatibility; Montreal, Que., Canada Aug. 13-17, 2001, vol. 1, 2001, pp. 378-382.

(Continued)

*Primary Examiner*—Timothy J Dole
(74) *Attorney, Agent, or Firm*—Lerner, David, Littenberg, Krumholz & Mentlik, LLP

(57) ABSTRACT

A device determines at least one characteristic of electromagnetic radiation emitted from a test object. A support receives the object. A network of probes is distributed along a substantially circular arc, and the support is disposed in a plane formed by the network of probes or in a plane parallel to the plane formed by the network of probes. The network of probes or the support is pivoted in the plane formed by the network of probes or in the plane parallel to the plane formed by the network of probes about a point located in that plane to vary an angle formed between a given one of the network of probes and the support, and thereby allow measurements to be taken at plural angular positions of the network of probes relative to the test object.

13 Claims, 2 Drawing Sheets

OTHER PUBLICATIONS

Ruoss et al., "EMC-investigation of hand-held mobile telephones using a double-cone nearfield to farfield transformation", Proceedings of the 26th. European Microwave Conference, Swanley, Nexus, Media, GB, vol. 2, No. 26, pp. 795-798, Sep. 9, 1996.

* cited by examiner

DEVICE AND METHOD FOR DETERMINING AT LEAST ONE VARIABLE ASSOCIATED WITH THE ELECTROMAGNETIC RADIATION OF AN OBJECT BEING TESTED

CROSS-REFERENCE TO RELATED APPLICATIONS

The present application is a national stage application under 35 U.S.C. § 371 of International Application No. PCT/FR2004/002140, filed Aug. 13, 2004, which claims priority from French Application No. 0309951, filed Aug. 14, 2003.

BACKGROUND OF THE INVENTION

The invention concerns devices and methods for the determination of at least one variable associated with the electromagnetic radiation from an object under test.

In order to determine the radiation diagram of and object under test, it has already been proposed that use should be made of devices that come in the form of a network of probes distributed in an arc around the object under test to be studied (a circular network).

We are familiar in particular with devices of this type that include means which allow the arc of probes and the object under test to rotate in relation to each other around an axis that corresponds to the diameter of the arc. In general, it is the object under test which rotates on itself around a vertical axis which corresponds to the diameter of the arc, but it can be envisaged, in a variant, that it is the arc of probes that rotates on itself, while the object under test remains fixed.

In this way, the network of probes measures the radiation of the object under test in successive planes spread around the axis of rotation of the arc and the object under test. In general then, the measurements are therefore taken on a sphere that totally surrounds the object under test.

We are also familiar with the use of networks of probes in an arc by moving, in a relative manner, the object under test perpendicularly in relation to the plane of the network of probes so as to measure the radiation on a cylinder enclosing the object.

The arrangement of a network of probes in a arc, whether used for measurements in spherical coordinates or measurements in cylindrical coordinates, nevertheless have limitations associated with the discrete measurement pitch imposed by the arrangement of the probes in a network.

In contrast to the case of a single probe which can be moved continuously, the use of a network of probes imposes constraints on the dimensions of the object under test, and whose field is to be measured.

In particular, according to theories that are well known in the near-field area, the number of sampling points is linked to the electrical dimension of the object under test.

Reference can be made in this regard to:

Hansen, J. E., Editor (1988) *Spherical Near-Field Antenna Measurements*, London: Peregrines In particular, the number of sampling points is a function of the radius (R) of the minimum sphere or of the minimum cylinder surrounding the object under test and verifies:

$N \approx (2\pi R/\lambda) + n$ where $n \approx 10$

As a consequence, it is understood that a network of N probes allows only the analysis of objects contained in a sphere or in a cylinder with a maximum radius R.

In other words, for a given analysis frequency or wavelength, and for a given network of probes, there exists a maximum size of objects capable of being analysed.

SUMMARY OF THE INVENTION

One aim of the invention is to circumvent this drawback, and to allow this constraint to be removed in order to broaden the area of use of a given network, in particular in terms of the size of the object under test or the range of frequencies or wavelengths at which it is capable of being analysed.

This aim is achieved by the invention through a device for the determination of at least one characteristic of electromagnetic radiation from an object under test that includes a support intended to receive the object and a network of probes distributed over a more or less circular arc, characterized in that it includes means that allow the relative tilting of the network of probes and of the support in the plane of the network of probes or parallel to the latter, so as to angularly shift the network of probes and the support in relation to each other, and thus allow measurements to be taken in several relative angular positions of the network of probes and the object under test.

This aim is achieved by the invention through a device for the determination of at least one characteristic of electromagnetic radiation from an object under test that includes a support intended to receive the said object and a network of probes distributed over a more or less circular arc, characterised in that it includes means that allow the relative tilting of the network of probes and of the support in the plane** of the network of probes or parallel to the latter, so as to angularly shift the network of probes and the support in relation to each other, and thus allow measurements to be taken in several relative angular positions of the network of probes and the object under test.

With such a device, it is possible to angularly shift the network of probes in relation to the support, while also supplying at least a second series of measurements. In this way, it is possible to multiply the number of points sampled in each plane, without increasing the hardware required.

The points obtained in the course of several successive series of measurements are then combined to form a denser mesh than that allowed by the circular network of probes.

BRIEF DESCRIPTION OF THE DRAWINGS

Other characteristics, aims and advantages of the invention will appear on reading the detailed description that follows, which is purely illustrative and not limiting in any way, and which should be read with reference to the appended drawings in which.

DETAILED DESCRIPTION

Figure 1:
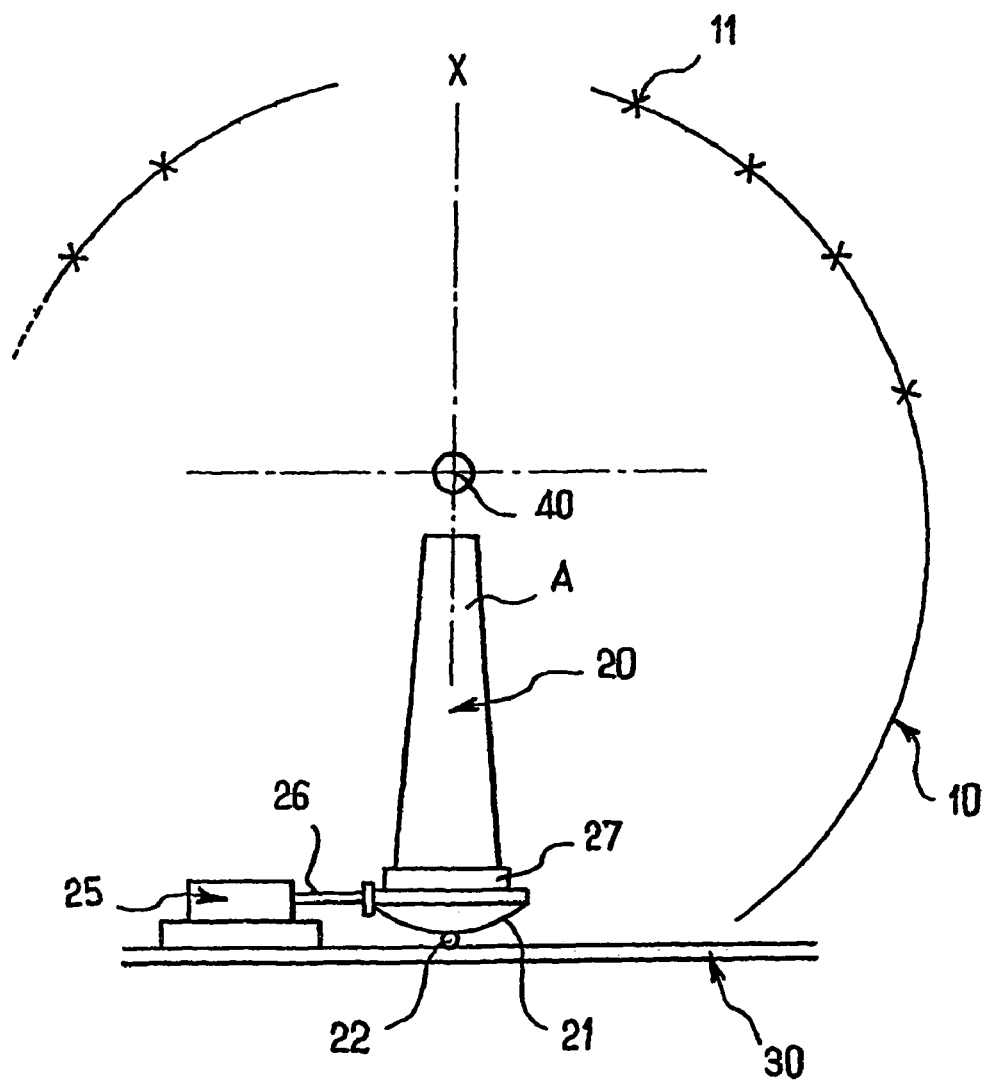
FIG. 1 is a diagrammatic representation of one possible mode of implementation of the invention.

FIG. 1 shows an arc 10 that includes a multiplicity of electromagnetic probes or measuring antennae 11 represented diagrammatically by crosses, as well as a support 20 intended to carry the object for which one is seeking to ascertain the electromagnetic behaviour (a mobile telephone for example). This support 20 is essentially a mast which extends from the ground 30 to close to the geometric centre of the arc. This geometric centre is highlighted in FIG. 1 by a circle 40.

The arc 10 is fixed in relation to the ground, while the mast comprising the support 20 is driven in rotation around its main axis, which is referenced by A in FIG. 1.

Driving means 27 of the geared type are provided for this purpose at the base of the mast.

Means are also provided which allow the base of the mast 20 to swing, and to be slightly pivoted, therefore slightly pivoting the object under test around the centre 40.

This pivoting allows axis A to be displaced angularly in relation to the network of probes, and several positions to be swept relative to axis A and the object under test in relation to the network of probes.

Thus, for each measurement plane, that is for each position for which the mast 20 is fixed in its rotation around its axis A, it is possible to take several consecutive readings that correspond to different relative angular displacements of the network of probes in relation to axis A and the object under test.

Tilting of the mast 20 in the plane of the arc is therefore used to multiply the electromagnetic measuring points around the object under test and to execute, with a network of probes of given pitch, a sampling method with a pitch that is less than the pitch of the network of probes, for example with an angular pitch which is a fraction of the pitch of the network of probes.

The tilting means is, for example, advantageously chosen to angularly sweep at least all of the angular pitch between two probes.

In the example illustrated in FIG. 1, these means include an electric motor 25 which drives an actuator 26.

This actuator extends more or less horizontally in the plane of the arc, and is hinged to one end of the base. The movement of this actuator is used to tilt the mast 20, conferring upon it a more or less pivoting movement that is centred on the centre 40 of the arc.

To allow this tilting motion, the base of the mast 20 is equipped with a convex bottom surface 21, which rests, by means of one or more rollers 22, on a complementary concave surface (not shown) on which it runs when the actuator is operated.

The complementary concave and convex shapes are chosen to allow the desired tilting/pivoting movement.

Figure 2:
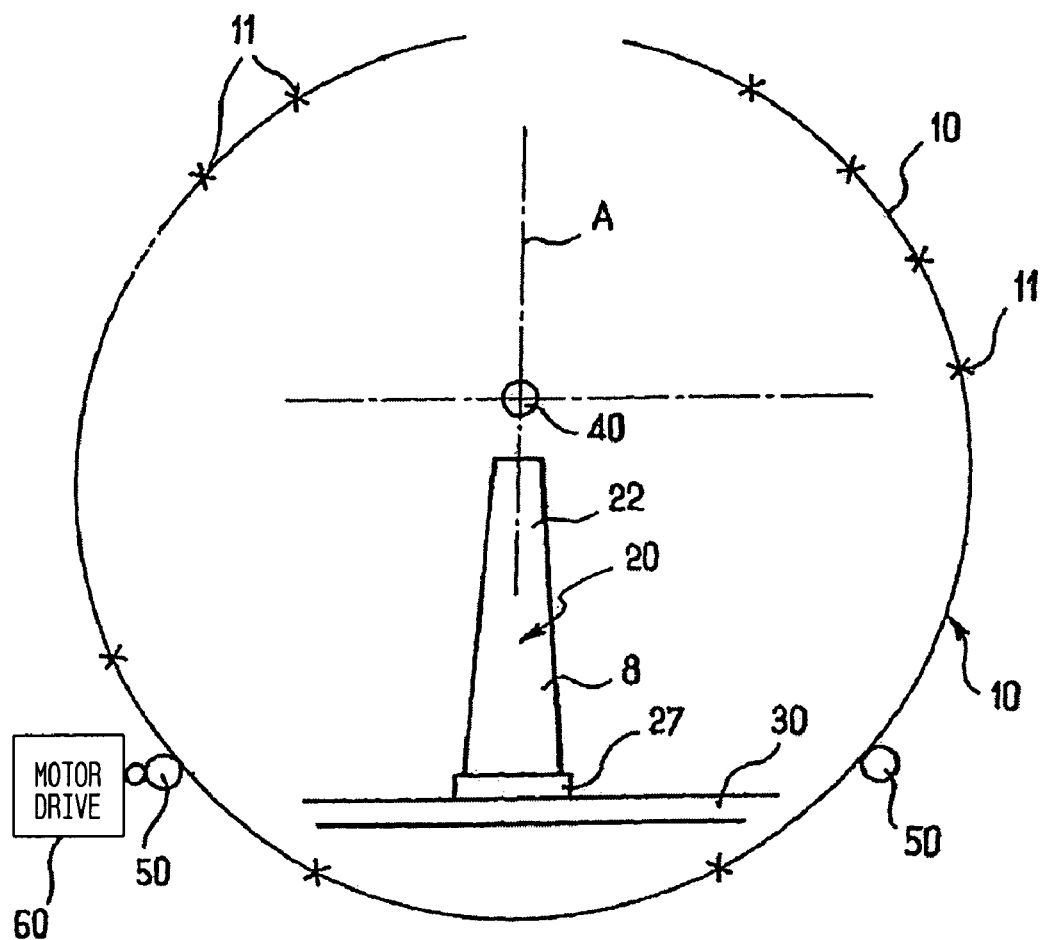
FIG. 2 is a diagrammatic representation of another possible mode of implementation of the invention.

Another mode of implementation is illustrated in FIG. 2.

In this mode of implementation, the mast 20 is mounted to rotate around its axis, while the arc 10 is mounted on rollers 50 that allow it to pivot on itself, in its plane, around the centre 40.

An electric motor drive 60 is provided for this purpose in order to move the arc on itself with an angular motion of at least one angular pitch.

This motor drive 60 allows movement in either direction of course.

It will be seen that in one or other of the two variants which have just been described, the object under test can itself be moved in translation perpendicularly to the plane of the network of probes so as to allow field measurement in cylindrical coordinates.

Means can be provided specifically at the level of the support in order to guide the object under test in a movement perpendicular to the plane of the network.

Of course the devices are then used with no rotation around the A axis.

For each relative position of the network of probes and the object under test, acquisitions are effected in several relative tilting positions of the network of probes in relation to the object under test.

One thus gets a measurement result corresponding to a multiplication of the number of points measured.

The structure proposed by the invention also results in a greater number of measuring points in relation to the network of probes used, and as a consequence, in larger dimensions for the object to be measured or in larger ranges of measurement frequencies or wavelengths.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A device for determining at least one characteristic of electromagnetic radiation emitted from a test object, said device comprising:
   a support for receiving the object;
   a network of probes distributed at a given pitch along a substantially circular arc, a main axis of the support being disposed in a plane formed by the network of probes or in a plane parallel to the plane formed by the network of probes; and
   means for providing a plurality of measurements using the network of probes, the plurality of measurements corresponding to a plurality of angular positions of a given one of the network of probes relative to the test object, and including:
      means for pivoting the network of probes about a point located in the plane formed by the network of probes or about a point located in the plane parallel to the plane formed by the network of probes to vary an angle formed between the given one of the network of probes and the main axis of the support in a manner that provides a total number of measurements in the plurality of measurements that is greater than a total number of probes in the network of probes.

2. A device according to claim 1, wherein said means for providing a plurality of measurements includes means for moving the support in relation to the ground.

3. A device according to claim 1, wherein said means for pivoting the network of probes includes means for moving the network of probes in relation to the ground.

4. A device according to claim 1, wherein the given pitch of the network of probes is defined as an angular pitch, and said means for pivoting the network of probes allows the angle formed between the given one of the network of probes and the main axis of the support to vary between successive ones of the plurality of measurements by less than the angular pitch of the network of probes.

5. A device according to claim 4, wherein said means for pivoting the network of probes allows the angle formed between the given one of the network of probes and the main axis of the support to vary between successive ones of the plurality of measurements by a fraction of the angular pitch of the network of probes.

6. A device according to claim 1, wherein the given pitch of the network of probes is defined as an angular pitch, and said means for pivoting the network of probes allows the angle formed between the given one of the network of probes and the main axis of the support to vary between successive ones of the plurality of measurements by more than the angular pitch of the network of probes.

7. A device according to claim 1, further comprising: means for driving one of the support and the network of probes to rotate about an axis formed of a diameter of the substantially circular arc.

8. A method for determining at least one characteristic of electromagnetic radiation emitted from a test object using a device according to claim 7, said method comprising:

positioning the test object on the support;

rotating at least one of the network of probes and the support about the axis formed of the diameter of the substantially circular arc to place the network of probes and the support at a plurality of relative positions of rotation, and for each one of the plurality of relative positions of rotation, pivoting one of the network of probes and the support about the point located in the plane formed by the network of probes or about the point located in the plane parallel to the plane formed by the network of probes to enable acquisition of data at a respective plurality of angular positions associated with that relative position of rotation; and carrying out the plurality of measurements by taking, at each one of the plurality of relative positions of rotation, measurements at each one of the associated plurality of angular positions.

9. A device according to claim 1, further comprising: means for displacing the test object relative to the network of probes in a direction perpendicular to the plane formed by the network of probes.

10. A method for determining at least one characteristic of electromagnetic radiation emitted from a test object using a device according to claim 9, said method comprising:

positioning the test object on the support;

moving the arc or the support in the direction perpendicular to the plane formed by the network of probes to place the network of probes and the support at a plurality of relative positions, and for each one of the plurality of relative positions, pivoting one of the network of probes and the support about the point located in the plane formed by the network of probes or about the point located in the plane parallel to the plane formed by the network of probes to enable acquisition of data at a respective plurality of angular positions associated with that relative position; and carrying out the plurality of measurements by taking, at each one of the plurality of relative positions, measurements at each one of the associated plurality of angular positions.

11. A method for determining at least one characteristic of electromagnetic radiation emitted from a test object using a device according to claim 1, said method comprising:

positioning the test object on the support;

pivoting the network of probes about the point located in the plane formed by the network of probes or about the point located in the plane parallel to the plane formed by the network of probes to enable acquisition of data at each one of the plurality of angular positions of the network of probes relative to the test object in a manner that provides a total number of angular positions in the plurality of angular positions that is greater than a total number of probes in the network of probes; and carrying out the plurality of measurements by taking measurements at each one of the plurality of angular positions.

12. A device for determining at least one characteristic of electromagnetic radiation emitted from a test object, said device comprising:

a support for receiving the object;

a network of probes distributed at a given pitch along a substantially circular arc, a main axis of the support being disposed in a plane formed by the network of probes or in a plane parallel to the plane formed by the network of probes; and means for providing a plurality of measurements using the network of probes, the plurality of measurements corresponding to a plurality of angular positions of a given one of the network of probes relative to the test object, and including:

means for pivoting one or more of the network of probes and the support about a point located in the plane formed by the network of probes or about a point located in the plane parallel to the plane formed by the network of probes to vary, between successive ones of the plurality of measurements, an angle formed between the given one of the network of probes and the main axis of the support by a fraction of the angular pitch of the network of probes so that a total number of measurements in the plurality of measurements is greater than a total number of probes in the network of probes.

13. A device for determining at least one characteristic of electromagnetic radiation emitted from a test object, said device comprising:

a support for receiving the object;

a network of probes distributed at a given pitch along a substantially circular arc, a main axis of the support being disposed in a plane formed by the network of probes or in a plane parallel to the plane formed by the network of probes; and means for providing a plurality of measurements using the network of probes, the plurality of measurements corresponding to a plurality of angular positions of a given one of the network of probes relative to the test object, and including:

means for moving the network of probes relative to the ground such that the network of probes is pivoted about a point located in the plane formed by the network of probes or about a point located in the plane parallel to the plane formed by the network of probes to vary an angle formed between the given one of the network of probes and the main axis of the support in a manner that provides a total number of measurements in the plurality of measurements that is greater than a total number of probes in the network of probes.

* * * * *

UNITED STATES PATENT AND TRADEMARK OFFICE
CERTIFICATE OF CORRECTION

PATENT NO. : 7,443,170 B2
APPLICATION NO. : 10/568378
DATED : October 28, 2008
INVENTOR(S) : Philippe Garreau et al.

It is certified that error appears in the above-identified patent and that said Letters Patent is hereby corrected as shown below:

On the Title page of the patent, Item (73), Assignee: "Techologies" should read --Technologiques--.

Column 2, line 23, after "the", delete "said".

Column 2, lines 24-25, "characterised" should read --characterized--.

Column 2, line 26, after "plane", delete "**".

Signed and Sealed this

Fifth Day of January, 2010

David J. Kappos
*Director of the United States Patent and Trademark Office*